US007214472B2

(12) United States Patent
Kobayashi

(10) Patent No.: US 7,214,472 B2

(45) Date of Patent: May 8, 2007

(54) PRINTING PLATE MATERIAL AND PRINTING PROCESS EMPLOYING THE SAME

(75) Inventor: Yasunobu Kobayashi, Hachioji (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 0 days.

(21) Appl. No.: 11/103,255

(22) Filed: Apr. 11, 2005

(65) Prior Publication Data

US 2005/0233244 A1 Oct. 20, 2005

(30) Foreign Application Priority Data

Apr. 19, 2004 (JP) ............................ 2004-122675

(51) Int. Cl.
*G03F 7/09* (2006.01)

(52) U.S. Cl. .............................. 430/281.1; 430/278.1; 430/286.1; 430/287.1; 430/302; 430/309; 430/435; 430/494; 430/944; 430/945

(58) Field of Classification Search ............. 430/270.1, 430/281.1, 286.1, 287.1, 302, 309, 494, 944, 430/945, 435, 278.1
See application file for complete search history.

(56) References Cited

U.S. PATENT DOCUMENTS

| | | | | |
|---|---|---|---|---|
| 5,567,568 | A * | 10/1996 | Nishioka | 430/162 |
| 6,548,222 | B2 | 4/2003 | Teng | |
| 6,890,702 | B2 * | 5/2005 | Matsumura | 430/284.1 |
| 2003/0118944 | A1 * | 6/2003 | Copeland et al. | 430/302 |
| 2005/0142483 | A1 * | 6/2005 | Yamasaki | 430/270.1 |

FOREIGN PATENT DOCUMENTS

| | | |
|---|---|---|
| EP | 1 285 751 | 2/2003 |
| EP | 1 348 570 | 10/2003 |
| EP | 1 403 041 | 3/2004 |
| JP | 2003098688 | 4/2003 |

* cited by examiner

*Primary Examiner*—Barbara L. Gilliam
(74) *Attorney, Agent, or Firm*—Lucas & Mercanti, LLP

(57) ABSTRACT

Disclosed is a printing plate material comprising a surface roughened aluminum support, and provided thereon, an image formation layer containing a heat-curable polymer having a main chain polymer in the main chain, and an acryloyl group or a methacryloyl group in the side chain, a glass transition temperature Tg of the main chain polymer being from 0 to 100° C., wherein the printing plate material is capable of being developed on a printing press.

9 Claims, No Drawings

PRINTING PLATE MATERIAL AND PRINTING PROCESS EMPLOYING THE SAME

This application is based on Japanese Patent Application No. 2004-122675 filed on Apr. 19, 2004 in Japanese Patent Office, the entire content of which is hereby incorporated by reference.

FIELD OF THE INVENTION

The present invention relates to a printing plate material and a printing process employing the printing plate material, and particularly to a printing plate material capable of forming an image by a computer to plate (CTP) system and a printing process employing the printing plate material.

BACKGROUND OF THE INVENTION

Recently, accompanied with digitization of printing data, a printing plate material for CTP, which is inexpensive, can be easily handled and has a printing ability comparable with that of a PS plate, is required. Particularly, a versatile thermal processless printing plate material, which can be applied to a printing press employing a direct imaging (DI) process without development by a special developing agent and which can be treated in the same manner as in PS plates, has been required.

In a thermal processless printing plate material, an image is formed according to a recording method employing an infrared laser emitting light with infrared to near infrared wavelengths. The thermal processless printing plate material employing this recording method is divided into ablation type, heat fusible type, phase change type, and polymerization/cross-linking type.

The ablation type printing plate materials are disclosed in for example, Japanese Patent O.P.I. Publication Nos. 8-507727, 6-186750, 6-199064, 7-314934, 10-58636, and 10-244773.

These references disclose a printing plate material comprising a substrate and a hydrophilic layer or a lipophilic layer, either of which is an outermost layer. In the printing plate material having a hydrophilic layer as an outermost layer, the hydrophilic layer is imagewise exposed to imagewise ablate the hydrophilic layer, whereby the lipophilic layer is exposed to form image portions.

As the heat fusible type printing plate material, there is one comprising a hydrophilic layer or a grained aluminum plate and provided thereon, an image formation layer containing thermoplastic particles, and a water soluble binder (see, for example, Patent Publication No. 2938397). A planographic printing plate material "Thermo Lite" produced by Agfa Co., Ltd. is of this type. This type of printing plate material can form an image only by energy necessary to heat fuse, reduce energy for image formation and form an image with high speed employing a high power laser, however, has problem in providing poor strength of the formed image and poor printing durability.

As the phase change type thermal processless printing plate material, there is a printing plate material comprising a hydrophilic layer containing hydrophobic precursor particles which changes to be hydrophobic at exposed portions, the hydrophilic layer being not removed during printing (see, for example, Japanese Patent O.P.I. Publication No. 11-240270). This type of printing plate material does not change adhesion of the image formation layer and maintains strength of the image formation layer, however, requires high energy for the phase change.

As the polymerization/cross-linking type thermal processless printing plate material, there are printing plate materials as disclosed in U.S. Pat. No. 6,548,222. This type printing plate material employing a roughened surface of an aluminum support increases strength of the image formation layer due to formation of a three dimensional network structure, and exhibits high adhesion of the image formation layer to the support due to anchor effect of the layer with the increased strength, providing greatly improved printing durability.

These printing plate materials for CTP are ones providing a printing plate by image formation only due to laser exposure without development employing a specific processing agent. They can form an image, but are difficult to enhance strength of the image formation layer for high printing durability, resulting in lowering of printing durability.

In the thermal processless plate, there is no extra process such as preheating, and only one method for curing the image formation layer is substantially heat due to laser exposure.

Short exposure time and low intensity exposure are required for improving productivity of a printing plate. Long exposure time and high intensity exposure lower productivity of a printing plate and cause interference with printing operation. Accordingly, there is a limit to only laser exposure.

There has been proposed another printing plate material forming an image according to heat and Ultraviolet light radiation (see for example, Japanese Patent O.P.I. Publication Nos. 2003-98688, 2003-107682, and 2003-107751.). There are, however, no proposals solving the problems as described above.

SUMMARY OF THE INVENTION

The present invention has been made in view of the above. An object of the invention is to provide a printing plate material providing prints with a sharp image, good on-press developability, high printing durability, print image with no stain at non-image portions, and excellent printability. Another object of the invention is to provide a printing process employing the printing plate material.

DETAILED DESCRIPTION OF THE INVENTION

The above object can be attained by the following constitution.

1. A printing plate material comprising a surface roughened aluminum support, and provided thereon, an image formation layer containing a heat-curable polymer having a main chain polymer in the main chain, and an acryloyl group or a methacryloyl group in the side chain, a glass transition temperature Tg of the main chain polymer being from 0 to 100° C., wherein the printing plate material is capable of being developed on a printing press.

2. The printing plate material of item 1 above, wherein the glass transition temperature Tg of the main chain polymer is from 10 to 95° C.

3. The printing plate material of item 1 above, wherein the glass transition temperature Tg of the main chain polymer is from 20 to 85° C.

4. The printing plate material of item 1 above, wherein the image formation layer contains the heat-curable polymer in an amount of from 50 to 99% by weight.

5. The printing plate material of item 1 above, wherein the heat-curable polymer further has a carboxyl group.

6. The printing plate material of item 1 above, wherein the heat-curable polymer is capable of being cured by UV irradiation.

7. The printing plate material of item 1 above, wherein the image formation layer further contains a water-soluble resin.

8. The printing plate material of item 1 above, further comprising a hydrophilic layer containing a light-to-heat conversion material.

9. The printing plate material of item 8 above, wherein the hydrophilic layer is provided between the aluminum support and the image formation layer.

10. The printing plate material of item 8 above, wherein the hydrophilic layer further contains metal oxide particles.

11. The printing plate material of item 10 above, wherein the metal oxide particles are selected from colloidal silica, alumina sol, and titania sol.

12. A printing process comprising the steps of:

providing the printing plate material of item 1 above on a plate cylinder of a printing press, imagewise exposing the printing plate material, carrying out printing by supplying printing ink and dampening water to the imagewise exposed printing plate material to form an image on the printing plate material, and then exposing the resulting printing plate material to ultraviolet light, whereby the formed image is cured.

Next, the present invention will be explained in detail. The printing plate material of the invention comprises a surface roughened aluminum plate and provided thereon, an image formation layer containing a heat-curable polymer, wherein the printing plate material is capable of being subjected to development on a printing press. The heat-curable polymer is preferably cured by ultraviolet light radiation, in view of providing improved printing durability.

In the invention, "development on a printing press" (hereinafter also referred to as "on-press development") means that when after an exposed printing plate material is mounted on a plate cylinder of a conventional off-set printing press, printing is carried out, the image formation layer at unexposed portions is removed in an initial printing stage by printing ink and/or a dampening solution supplied to the printing plate material surface.

(Aluminum Support)

As material for the aluminum support in the invention, any known aluminum plates used as a support for a planographic printing plate material can be used. The thickness of the aluminum plate is not specifically limited as long as it is such a thickness that can be mounted on a plate cylinder of a printing press, but is preferably from 50 to 500 μm.

The aluminum plate is used after the surface of the aluminum plate is degreased by bases, acids or solvents to remove oil remaining on the plate surface which has been used during rolling or winding up. Degreasing is preferably carried out in an aqueous alkali solution. A surface roughened aluminum plate is used. There are various surface roughening methods of the aluminum plate such as a mechanically surface roughening method, an electrochemically etching method, and a chemically etching method. Examples of the mechanically surface roughening method include a ball graining method, a brush graining method, a blast graining method, and a buffing graining method. The electrochemically etching method is ordinarily carried out in a hydrochloric acid or nitric acid solution, employing an alternating current or a direct current. There are methods disclosed in Japanese Patent O.P.I. Publication No. 54-63902, in which the both methods are combined. It is preferred that the thus surface roughened aluminum plate is optionally subjected to alkali etching treatment and neutralization treatment, and then to anodization treatment in order to enhance water retention and abrasion resistance of the plate surface. As an electrolyte used in the anodization treatment, there are various ones forming a porous film. Examples thereof include sulfuric acid, phosphoric acid, oxalic acid, chromic acid and their mixture. The concentration of the electrolyte in the electrolytic solution is suitably determined according to kinds of electrolytes used.

The anodization conditions cannot be limited since they vary according to kinds of an electrolytic solution used. However, it is preferred that anodization is carried out in an electrolytic solution containing an electrolyte in an amount of 1 to 80% ny weight at 5 to 70° C. for from 10 seconds to 5 minutes at a current density of from 5 to 60 $A/dm^2$ and at a voltage of from 1 to 100V. The coating amount of the formed anodization film is preferably from 1 to 10 $g/m^2$. A printing plate comprising an aluminum support with an anodization film thickness within the above coating amount range provides sufficient printing durability and excellent anti-scratching property.

In the invention, the aluminum plate surface roughened as described above can increase adhesion to a hydrophilic layer and provide high printing durability.

A backcoat layer is preferably provided on the rear surface of the aluminum plate opposite the image formation layer in order to control (for example, to reduce its friction of a plate cylinder surface) slippage of the rear surface.

(Image Formation Layer)

In the invention, the image formation layer forms an image employing heat generated due to infrared laser exposure. The image formation layer contains a heat-curable polymer. The heat-curable polymer (hereinafter also referred to as the heat-curable polymer in the invention) has a main chain polymer (hereinafter also referred to as a backbone polymer) in the main chain, and an acryloyl group or a methacryloyl group (hereinafter also referred to as a (meth) acryloyl group) in the side chain, in which a glass transition temperature Tg of the main chain polymer (backbone polymer) is from 0 to 100° C. The heat-curable polymer in the invention is preferably cured by UV light exposure. In the invention, the main chain polymer refers to a polymer obtained by removing, from the heat-curable polymer in the invention, the (meth)acryloyl group of the heat-curable polymer.

The heat-curable polymer in the invention can form a coated layer singly without requiring a binder resin for carrying, although a polymerizable monomer requires a resin for carrying it. The coated layer from the heat-curable polymer in the invention can enhance its strength.

The heat-curable polymer in the invention in the image formation layer can be cured by heat or UV light, therefore, it is preferred that after an image is thermally formed on the image formation layer, and the image formation layer at unexposed portions is removed, the image formation layer at image portions is further cured by UV light exposure to further enhance its strength.

On-Press Development and UV Light Exposure

The printing plate material of the invention is characterized in that the heat-curable polymer in the invention is easily removed from the printing plate material by water, and can be cured by heat or UV light to render insoluble in water to form a layer with high fastness.

The image formation method of the invention is as follows:

1. The image formation layer is exposed employing a laser, and an image is formed in the image formation layer by heat generated due to laser exposure. (On-press development)
2. The printing plate material is mounted on a plate cylinder of a printing press, and the image formation layer at unexposed portions is removed by a dampening water at initial printing stage. Printing can be carried out without any additional treatment, however, it is preferred that the image formation layer at exposed portions is further exposed to UV light to accelerate curing, whereby the image strength is further enhanced.

As the heat-curable polymer in the invention, polymers as disclosed in Japanese Patent O.P.I. Publication No. 2003-40923 and heat/UV light curable polymers synthesized according to the synthetic method as disclosed in Japanese Patent O.P.I. Publication No. 2003-40923 can be used.

The heat-curable polymer in the invention is for example, a polymer obtained by neutralizing a part of the carboxyl groups of a carboxyl group-containing polymer with a base, and adding a compound having an acryloyl or methacryloyl group to the resulting polymer or a copolymer obtained by copolymerizing a carboxyl group-containing monomer and a monomer having a carboxyl group neutralized with a base to obtain a copolymer, and adding a compound having an acryloyl or methacryloyl group to the resulting copolymer.

The carboxyl group-containing polymer is a polymer obtained by polymerization of a carboxyl group-containing monomer or a monomer producing a carboxyl group by polymerization. Examples of such a monomer include (meth)acrylic acid; crotonic acid; o-vinylbenzoic acid; m-vinylbenzoic acid; p-vinylbenzoic acid; maleic acid; fumaric acid; itaconic acid; citraconic acid; β-(meth)acryloyloxyhydrogensuccinic acid; β-(meth)acryloyloxyhydrogenphthalic acid; and acrylic acid dimer. Acrylic acid, or methacrylic acid is preferred.

The polymer is preferably a copolymer obtained by copolymerizing the above monomer and second monomers described below to have a functional group in the copolymer. As the second monomers, there is a monomer having a functional group such as an amide group, an acid anhydride group, a substituted or unsubstituted amino group, an alkylolated amino group, a hydroxyl group, or an epoxy group (including an alicyclic epoxy group). Typical examples thereof include (meth)acrylic acid, itaconic acid, maleic acid, fumaric acid, crotonic acid, (meth)acrylamide, methylolated (meth)acrylamide, diethylaminoethyl (meth)acrylate, diethylaminopropyl (meth)acrylate, β-hydroxyethyl (meth)acrylate, β-hydroxy (meth)acrylate, polyethylene glycol monoacrylate, glycidyl (meth)acrylate, and acrylonitrile.

As the polymer is preferred an acryl polymer obtained by polymerization of one or more of (meth)acrylic acid, alkyl (meth)acrylate, β-(meth)acryloyloxyhydrogensuccinic acid, β-(meth)acryloyloxyhydrogenphthalic acid, and acrylic acid dimer or by copolymerization of these monomers with crotonic acid, o-vinylbenzoic acid, m-vinylbenzoic acid, p-vinylbenzoic acid, maleic acid; fumaric acid, itaconic acid; citraconic acid, β-(meth)acryloyloxyhydrogensuccinic acid, β-(meth)acryloyloxyhydrogenphthalic acid, or acrylic acid dimer. As typical examples, there are a copolymer of acrylic acid and ethyl acrylate and a copolymer of acrylic acid and 2-ethylhexyl acrylate.

The heat-curable polymer in the invention has a weight average molecular weight of preferably from 5,000 to 1,000,000, more preferably from 10,000 to 500,000, and still more preferably from 20,000 to 100,000. In the invention, the main chain polymer of the heat-curable polymer in the invention has a Tg of from 0 to 100° C., preferably from 10 to 95° C., and more preferably from 20 to 85° C.

The image formation layer in the invention contains the heat-curable polymer in the invention in an amount of preferably from 50 to 99% by weight, and more preferably from 70 to 95% by weight.

The image formation layer in the invention preferably contains a water-soluble resin. Examples thereof include polysaccharides, polyethylene oxide, polypropylene oxide, polyvinyl alcohol, polyethylene glycol (PEG), polyvinyl ether, a styrene-butadiene copolymer, a conjugation diene polymer latex of methyl methacrylate-butadiene copolymer, an acryl polymer latex, a vinyl polymer latex, polyacrylamide, polyvinyl pyrrolidone, and polyacrylic acid.

The image formation layer in the invention can contain heat melting particles or heat fusible particles. These are particles formed from materials generally classified into wax. The materials preferably have a softening point of from 40° C. to 120° C. and a melting point of from 60° C. to 150° C., and more preferably a softening point of from 40° C. to 100° C. and a melting point of from 60° C. to 120° C. The melting point less than 60° C. has a problem in storage stability and the melting point exceeding 150° C. lowers ink receptive sensitivity.

Materials usable include paraffin, polyolefin, polyethylene wax, microcrystalline wax, and fatty acid wax. The molecular weight thereof is approximately from 800 to 10,000. A polar group such as a hydroxyl group, an ester group, a carboxyl group, an aldehyde group and a peroxide group may be introduced into the wax by oxidation to increase the emulsification ability. Moreover, stearoamide, linolenamide, laurylamide, myristylamide, hardened cattle fatty acid amide, parmitylamide, oleylamide, rice bran oil fatty acid amide, palm oil fatty acid amide, a methylol compound of the above-mentioned amide compounds, methylenebissteastearoamide and ethylenebissteastearoamide may be added to the wax to lower the softening point or to raise the working efficiency. A cumarone-indene resin, a rosin-modified phenol resin, a terpene-modified phenol resin, a xylene resin, a ketone resin, an acryl resin, an ionomer and a copolymer of these resins may also be usable.

Among them, polyethylene, microcrystalline wax, fatty acid ester and fatty acid are preferably contained. A high sensitive image formation can be performed since these materials each have a relative low melting point and a low melt viscosity. These materials each have a lubrication ability. Accordingly, even when a shearing force is applied to the surface layer of the printing plate precursor, the layer damage is minimized, and resistance to stain, which may be caused by scratch, is further enhanced.

The heat melting particles are preferably dispersible in water. The average particle size thereof is preferably from 0.01 to 10 μm, and more preferably from 0.1 to 3 μm. The above average particle size range of the heat melting particles is preferred in view of on-press developability, resistance to stains, or resolution.

The composition of the heat melting particles may be continuously varied from the interior to the surface of the particles.

The particles may be covered with a different material. Known microcapsule production method or sol-gel method can be applied for covering the particles. The heat melting particle content of the layer is preferably 1 to 90% by weight, and more preferably 5 to 80% by weight based on the total layer weight.

The heat fusible particles include thermoplastic hydrophobic polymer particles. Although there is no specific limitation to the upper limit of the softening point of the thermoplastic hydrophobic polymer, the softening point is preferably lower than the decomposition temperature of the polymer. The weight average molecular weight (Mw) of the thermoplastic hydrophobic polymer is preferably within the range of from 10,000 to 1,000,000.

Examples of the polymer consisting the polymer particles include a diene (co)polymer such as polypropylene, polybutadiene, polyisoprene or an ethylene-butadiene copolymer; a synthetic rubber such as a styrene-butadiene copolymer, a methyl methacrylate-butadiene copolymer or an acrylonitrile-butadiene copolymer; a (meth)acrylate (co)polymer or a (meth)acrylic acid (co)polymer such as polymethyl methacrylate, a methyl methacrylate-(2-ethylhexyl)acrylate copolymer, a methyl methacrylate-methacrylic acid copolymer, or a methyl acrylate-(N-methylolacrylamide); polyacrylonitrile; a vinyl ester (co)polymer such as a polyvinyl acetate, a vinyl acetate-vinyl propionate copolymer and a vinyl acetate-ethylene copolymer, or a vinyl acetate-2-hexylethyl acrylate copolymer; and polyvinyl chloride, polyvinylidene chloride, polystyrene and a copolymer thereof. Among them, the (meth)acrylate polymer, the (meth)acrylic acid (co)polymer, the vinyl ester (co)polymer, the polystyrene and the synthetic rubbers are preferably used.

The polymer particles may be prepared from a polymer synthesized by any known method such as an emulsion polymerization method, a suspension polymerization method, a solution polymerization method and a gas phase polymerization method. The particles of the polymer synthesized by the solution polymerization method or the gas phase polymerization method can be produced by a method in which an organic solution of the polymer is sprayed into an inactive gas and dried, and a method in which the polymer is dissolved in a water-immiscible solvent, then the resulting solution is dispersed in water or an aqueous medium and the solvent is removed by distillation. In both of the methods, a surfactant such as sodium lauryl sulfate, sodium dodecylbenzenesulfate or polyethylene glycol, or a water-soluble resin such as poly(vinyl alcohol) may be optionally used as a dispersing agent or stabilizing agent.

The heat fusible particles are preferably dispersible in water. The average particle size of the heat fusible particles is preferably from 0.01 to 10 μm, and more preferably from 0.1 to 3 μm. The above average particle size range of the heat melting particles is preferred in view of on-press developability, resistance to stains, or resolution.

Further, the composition of the heat fusible particles may be continuously varied from the interior to the surface of the particles. The particles may be covered with a different material. As a covering method, known methods such as a microcapsule method and a sol-gel method are usable. The heat fusible particle content of the layer is preferably from 1 to 90% by weight, and more preferably from 5 to 80% by weight based on the total weight of the layer.

The image formation layer of the printing plate material in the invention can contain layer structural clay mineral particles. Examples of the layer structural clay mineral particles include a clay mineral such as kaolinite, halloysite, talk, smectite such as montmorillonite, beidellite, hectorite and saponite, vermiculite, mica and chlorite; hydrotalcite; and a layer structural polysilicate such as kanemite, makatite, ilerite, magadiite and kenyte.

Among them, ones having a higher electric charge density of the unit layer are higher in the polarity and in the hydrophilicity. Preferable charge density is not less than 0.25, more preferably not less than 0.6. Examples of the layer structural mineral particles having such a charge density include smectite having a negative charge density of from 0.25 to 0.6 and bermiculite having a negative charge density of from 0.6 to 0.9. Synthesized fluorinated mica is preferable since one having a stable quality, such as the particle size, is available. Among the synthesized fluorinated mica, swellable one is preferable and one freely swellable is more preferable.

An intercalation compound of the foregoing layer structural mineral particles such as a pillared crystal, or one treated by an ion exchange treatment or a surface treatment such as a silane coupling treatment or a complication treatment with an organic binder is also usable.

It is preferred that planar structural mineral particles have an average particle size (an average of the largest particle length) of less than 1 μm, and an average aspect ratio of not less than 50 in a state contained in the layer (including the case that the particles have been subjected to swell processing and dispersing layer-separation processing). When the average particle size is less than 1 μm, continuity to the parallel direction, which is a trait of the layer structural particle, and softness, are given to the coated layer so that a strong dry layer in which a crack is difficult to be formed can be obtained.

The coating solution containing particles in a large amount can minimize particle sedimentation due to a viscosity increasing effect of the layer structural clay mineral particles. The average particle size of the above value can form a uniform layer, and increase strength of the layer.

The average aspect ratio of the above value increases proportion of the planar particles, and provides sufficient viscosity increasing effect, resulting in enhancing of particle sedimentation preventing effect. The content of the layer structural clay mineral particles is preferably from 0.1 to 30% by weight, and more preferably from 1 to 10% by weight based on the total weight of the image formation layer. Particularly, the addition of the swellable synthesized fluorinated mica or smectite is effective if the adding amount is small. The layer structural clay mineral particles may be added in the form of powder to a coating liquid, but it is preferred that gel of the particles which is obtained by being swelled in water, is added to the coating liquid in order to obtain a good dispersity according to an easy coating liquid preparation method which requires no dispersion process comprising dispersion due to media.

The image formation layer can further contain a light-to-heat conversion material described later. The image formation layer contains the light-to-heat conversion material in an amount of from 0.1 to 10% by weight, and more preferably from 0.2 to 5% by weight. The image formation layer can further contain a light-to-heat conversion material described later. The image formation layer can further contain a water-soluble surfactant. A silicon atom-containing surfactant and a fluorine atom-containing surfactant can be used. The silicon atom-containing surfactant is especially preferred in that it minimizes printing contamination. The content of the surfactant is preferably from 0.01 to 3.0% by weight, and more preferably from 0.03 to 1.0% by weight based on the total weight of the image formation layer (or the solid of the coating solution).

The image formation layer can contain an acid (phosphoric acid or acetic acid) or an alkali (sodium hydroxide, silicate, or phosphate) to adjust pH.

The coating amount of the image formation layer is from 0.01 to 10 g/$m^2$, preferably from 0.1 to 3 g/$m^2$, and more preferably from 0.2 to 2 g/$m^2$.

(Hydrophilic Layer)

It is preferred that the printing plate material of the invention further comprises a hydrophilic layer containing a light-to-heat conversion material provided on the aluminum support. The hydrophilic layer improves adhesion to the image formation layer and developability, and increases efficiency of light-to-heat conversion resulting from heat generated by infrared laser. The hydrophilic layer contains the light-to-heat conversion material in an amount of preferably from 0.2 to 30% by weight, and more preferably from 0.5 to 20% by weight.

Materials constituting the hydrophilic layer in the invention will be explained below.

The materials constituting the hydrophilic layer are preferably metal oxides, and more preferably metal oxide particles. The hydrophilic layer contains the metal oxides in an amount of preferably from 50 to 99.5% by weight, and more preferably from 60 to 95% by weight. Examples of the metal oxide particles include colloidal silica particles, an alumina sol, a titania sol and another metal oxide sol. The metal oxide particles may have any shape such as spherical, needle-like, and feather-like shape. The average particle size is preferably from 3 to 100 nm, and plural kinds of metal oxide each having a different size may be used in combination.

The surface of the particles may be subjected to surface treatment. The metal oxide particles can be used as a binder, utilizing its layer forming ability.

The metal oxide particles are suitably used in a hydrophilic layer since they minimize lowering of the hydrophilicity of the layer as compared with an organic compound binder. Among the above-mentioned, colloidal silica is particularly preferred. The colloidal silica has a high layer forming ability under a drying condition with a relative low temperature, and can provide a good layer strength.

It is preferred that the colloidal silica is necklace-shaped colloidal silica or colloidal silica particles having an average particle size of not more than 20 nm. Further, it is preferred that the colloidal silica provides an alkaline colloidal silica solution as a colloid solution. The necklace-shaped colloidal silica is a generic term of an aqueous dispersion system of spherical silica having a primary particle size of the order of nm.

The necklace-shaped colloidal silica to be used in the invention means a "pearl necklace-shaped" colloidal silica formed by connecting spherical colloidal silica particles each having a primary particle size of from 10 to 50 μm so as to attain a length of from 50 to 400 nm. The term of "pearl necklace-shaped" means that the image of connected colloidal silica particles is like to the shape of a pearl necklace. The bonding between the silica particles forming the necklace-shaped colloidal silica is considered to be —Si—O—Si—, which is formed by dehydration of —SiOH groups located on the surface of the silica particles.

Concrete examples of the necklace-shaped colloidal silica include Snowtex-PS series produced by Nissan Kagaku Kogyo, Co., Ltd. As the products, there are Snowtex-PS-S (the average particle size in the connected state is approximately 110 nm), Snowtex-PS-M (the average particle size in the connected state is approximately 120 nm) and Snowtex-PS-L (the average particle size in the connected state is approximately 170 nm). Acidic colloidal silicas corresponding to each of the above-mentioned are Snowtex-PS-S-O, Snowtex-PS-M-O and Snowtex-PS-L-O, respectively. The necklace-shaped colloidal silica is preferably used in a hydrophilic layer as a porosity providing material for hydrophilic matrix phase, and porosity and strength of the layer can be secured by its addition to the layer. Among them, the use of Snowtex-PS-S, Snowtex-PS-M or Snowtex-PS-L, each being alkaline colloidal silica particles, is particularly preferable since the strength of the hydrophilic layer is increased and occurrence of background contamination is inhibited even when a lot of prints are printed.

It is known that the binding force of the colloidal silica particles is become larger with decrease of the particle size. The average particle size of the colloidal silica particles to be used in the invention is preferably not more than 20 nm, and more preferably 3 to 15 nm. As above-mentioned, the alkaline colloidal silica particles show the effect of inhibiting occurrence of the background contamination. Accordingly, the use of the alkaline colloidal silica particles is particularly preferable.

Examples of the alkaline colloidal silica particles having the average particle size within the foregoing range include Snowtex-20 (average particle size: 10 to 20 nm), Snowtex-30 (average particle size: 10 to 20 nm), Snowtex-40 (average particle size: 10 to 20 nm), Snowtex-N (average particle size: 10 to 20 nm), Snowtex-S (average particle size: 8 to 11 nm) and Snowtex-XS (average particle size: 4 to 6 nm), each produced by Nissan Kagaku Co., Ltd.

The colloidal silica particles having an average particle size of not more than 20 nm, when used together with the necklace-shaped colloidal silica as described above, is particularly preferred, since appropriate porosity of the layer is maintained and the layer strength is further increased. The ratio of the colloidal silica particles having an average particle size of not more than 20 nm to the necklace-shaped colloidal silica is preferably from 95/5 to 5/95, more preferably from 70/30 to 20/80, and most preferably from 60/40 to 30/70.

The hydrophilic layer in the invention preferably contains porous metal oxide particles having a particle size of less than 1 μm as porosity-providing materials. Examples of the porous metal oxide particles include porous silica particles, porous aluminosilicate particles or zeolite particles, each described later.

The porous silica particles are ordinarily produced by a wet method or a dry method. By the wet method, the porous silica particles can be obtained by drying and pulverizing a gel prepared by neutralizing an aqueous silicate solution, or pulverizing the precipitate formed by neutralization. By the dry method, the porous silica particles are prepared by combustion of silicon tetrachloride together with hydrogen and oxygen to precipitate silica. The porosity and the particle size of such particles can be controlled by variation of the production conditions.

The porous silica particles prepared from the gel by the wet method is particularly preferred.

The porous aluminosilicate particles can be prepared by the method described in, for example, JP O.P.I. No. 10-71764. Thus prepared aluminosilicate particles are amorphous complex particles synthesized by hydrolysis of aluminum alkoxide and silicon alkoxide as the major components. The particles can be synthesized so that the ratio of alumina to silica in the particles is within the range of from 1:4 to 4:1.

Complex particles composed of three or more components prepared by an addition of another metal alkoxide may also be used in the invention. In such a particle, the porosity and the particle size can be controlled by adjustment of the production conditions. The porosity of the particles is preferably not less than 0.5 ml/g, more preferably not less than 0.8 ml/g, and most preferably of from 1.0 to 2.5 ml/g, in terms of pore volume before the dispersion. The pore volume is closely related to water retention of the coated layer. As the pore volume increases, the water retention is increased, stain is difficult to occur, and water tolerance is high. Particles having a pore volume of more than 2.5 ml/g are brittle, resulting in lowering of durability of the layer containing them. Particles having a pore volume of less than 0.5 ml/g results in poor printability.

As the porosity-providing material, zeolite can be used. Zeolite is a crystalline aluminosilicate, which is a porous material having voids of a regular three dimensional net work structure and having a pore size of 0.3 to 1 nm. Natural and synthetic zeolites are expressed by the following formula.

$$(M^1,(M^2)_{1/2})_m(Al_mSi_nO_{2*(m+n)})\cdot xH_2O$$

In the above, $M^1$ and $M^2$ are each exchangeable cations. Examples of $M^1$ include $Li^+$, $Na^+$, $K^+$, $Tl^+$, $Me_4N^+$ (TMA), $Et_4N^+$ (TEA), $Pr_4N^+$ (TPA), $C_7H_{15}N^{2+}$, and $C_8H_{16}N^+$, and examples of $M^2$ include $Ca^{2+}$, $Mg^{2+}$, $Ba^{2+}$, $Sr^{2+}$ and $(C_8H_{18}N)_2^{2+}$. Relation of n and m is $n \geqq m$, and consequently, the ratio of m/n, or that of Al/Si is not more than 1. A higher Al/Si ratio shows a higher content of the exchangeable cation, and a higher polarity, resulting in higher hydrophilicity. The Al/Si ratio is within the range of preferably from 0.4 to 1.0, and more preferably 0.8 to 1.0. x is an integer.

Synthetic zeolite having a stable Al/Si ratio and a sharp particle size distribution is preferably used as the zeolite particles to be used in the invention. Examples of such zeolite include Zeolite A: $Na_{12}(Al_{12}Si_{12}O_{48}).27H_2O$; Al/Si=1.0, Zeolite X: $Na_{86}(Al_{86}Si_{106}O_{384}).264H_2O$; Al/Si=0.811, and Zeolite Y: $Na_{56}(Al_{56}Si_{136}O_{384}).250H_2O$; Al/Si=0.412. Containing the porous zeolite particles having an Al/Si ratio within the range of from 0.4 to 1.0 in the hydrophilic layer greatly raises the hydrophilicity of the hydrophilic layer itself, whereby contamination in the course of printing is inhibited and the water retention latitude is also increased.

Containing the porous zeolite particles having an Al/Si ratio within the range of from 0.4 to 1.0 in the hydrophilic layer greatly raises the hydrophilicity of the hydrophilic layer itself, whereby contamination in the course of printing is inhibited and the water retention latitude is also increased. Further, contamination caused by a finger mark is also greatly reduced. When Al/Si is less than 0.4, the hydrophilicity is insufficient and the above-mentioned improving effects are lowered.

The hydrophilic layer of the printing plate material in the invention can contain layer structural clay mineral particles. Examples of the layer structural clay mineral particles include a clay mineral such as kaolinite, halloysite, talk, smectite such as montmorillonite, beidellite, hectorite and saponite, vermiculite, mica and chlorite; hydrotalcite; and a layer structural polysilicate such as kanemite, makatite, ilerite, magadiite and kenyte. Among them, ones having a higher electric charge density of the unit layer are higher in the polarity and in the hydrophilicity. Preferable charge density is not less than 0.25, more preferably not less than 0.6. Examples of the layer structural mineral particles having such a charge density include smectite having a negative charge density of from 0.25 to 0.6 and bermiculite having a negative charge density of from 0.6 to 0.9. Synthesized fluorinated mica is preferable since one having a stable quality, such as the particle size, is available. Among the synthesized fluorinated mica, swellable one is preferable and one freely swellable is more preferable.

An intercalation compound of the foregoing layer structural mineral particles such as a pillared crystal, or one treated by an ion exchange treatment or a surface treatment such as a silane coupling treatment or a complication treatment with an organic binder is also usable.

It is preferred that planar structural mineral particles have an average particle size (an average of the largest particle length) of less than 1 μm, and an average aspect ratio of not less than 50 in a state contained in the layer (including the case that the particles have been subjected to swell processing and dispersing layer-separation processing). When the average particle size is less than 1 μm, continuity to the parallel direction, which is a trait of the layer structural particle, and softness, are given to the coated layer so that a strong dry layer in which a crack is difficult to be formed can be obtained.

The coating solution containing particles in a large amount can minimize particle sedimentation due to a viscosity increasing effect of the layer structural clay mineral particles. The average particle size of the above value can form a uniform layer, and increase strength of the layer.

The average aspect ratio of the above value increases proportion of the planar particles, and provides sufficient viscosity increasing effect, resulting in enhancing of particle sedimentation preventing effect. The content of the layer structural clay mineral particles is preferably from 0.1 to 30% by weight, and more preferably from 1 to 10% by weight based on the total weight of the hydrophilic layer. Particularly, the addition of the swellable synthesized fluorinated mica or smectite is effective if the adding amount is small. The layer structural clay mineral particles may be added in the form of powder to a coating liquid, but it is preferred that gel of the particles which is obtained by being swelled in water, is added to the coating liquid in order to obtain a good dispersity according to an easy coating liquid preparation method which requires no dispersion process comprising dispersion due to media.

An aqueous solution of a silicate is also usable as another additive to the hydrophilic matrix phase in the invention. An alkali metal silicate such as sodium silicate, potassium silicate or lithium silicate is preferable, and the $SiO_2/M_2O$ is preferably selected so that the pH value of the coating liquid after addition of the silicate exceeds 13 in order to prevent dissolution of the porous metal oxide particles or the colloidal silica particles.

An inorganic polymer or an inorganic-organic hybrid polymer prepared by a sol-gel method employing a metal alkoxide. Known methods described in S. Sakka "Application of Sol-Gel Method" or in the publications cited in the above publication can be applied to prepare the inorganic polymer or the inorganic-organic hybridpolymer by the sol-gel method.

In the invention, the hydrophilic layer can contain a water-soluble resin. Examples of the water-soluble resin include a polysaccharide, polyethylene oxide, polypropylene oxide, polyvinyl alcohol, polyethylene glycol (PEG), polyvinyl ether, a styrene-butadiene copolymer, a conjugation diene polymer latex of methyl methacrylate-butadiene copolymer, an acryl polymer latex, a vinyl polymer latex, polyacrylamide, and polyvinyl pyrrolidone. The water-soluble resin contained in the hydrophilic layer is preferably a polysaccharide.

As the polysaccharide, starches, celluloses, polyuronic acid and pullulan can be used. Among them, a cellulose derivative such as a methyl cellulose salt, a carboxymethyl cellulose salt or a hydroxyethyl cellulose salt is preferable, and a sodium or ammonium salt of carboxymethyl cellulose is more preferable. These polysaccharides can form a preferred surface shape of the hydrophilic layer.

The surface of the hydrophilic layer preferably has a convexoconcave structure having a pitch of from 0.1 to 50 μm such as the grained aluminum surface of an aluminum PS plate. The water retention ability and the image maintaining ability are raised by such a convexoconcave structure of the surface. Such a convexoconcave structure can also be formed by adding in an appropriate amount a filler having a suitable particle size to the coating liquid of the hydrophilic layer. However, the convexoconcave structure is preferably formed by coating a coating liquid for the hydrophilic layer containing the alkaline colloidal silica and the water-soluble polysaccharide so that the phase separation occurs at the time of drying the coated liquid, whereby a structure is obtained which provides a good printing performance.

The shape of the convexoconcave structure such as the pitch and the surface roughness thereof can be suitably controlled by the kinds and the adding amount of the alkaline colloidal silica particles, the kinds and the adding amount of the water-soluble polysaccharide, the kinds and the adding amount of another additive, a solid concentration of the coating liquid, a wet layer thickness or a drying condition.

In the invention, it is preferred that at least a part of the water-soluble resin added to the hydrophilic layer exists in the hydrophilic layer in a state capable of being dissolved in water.

A cationic resin may also be contained in the hydrophilic layer. Examples of the cationic resin include a polyalkylene-polyamine such as a polyethyleneamine or polypropylene-polyamine or its derivative, an acryl resin having a tertiary amino group or a quaternary ammonium group and diacrylamine. The cationic resin may be added in a form of fine particles. Examples of such particles include the cationic microgel described in Japanese Patent O.P.I. Publication No. 6-161101.

A water-soluble surfactant may be added for improving the coating ability of the coating liquid for the hydrophilic layer in the invention. A silicon atom-containing surfactant and a fluorine atom-containing surfactant are preferably used. The silicon atom-containing surfactant is especially preferred in that it minimizes printing contamination. The content of the surfactant is preferably from 0.01 to 3% by weight, and more preferably from 0.03 to 1% by weight based on the total weight of the hydrophilic layer (or the solid content of the coating liquid).

The hydrophilic layer in the invention can contain a phosphate. Since a coating liquid for the hydrophilic layer is preferably alkaline, the phosphate to be added to the hydrophilic layer is preferably sodium phosphate or sodium monohydrogen phosphate. The addition of the phosphate provides improved reproduction of dots at shadow portions. The content of the phosphate is preferably from 0.1 to 5% by weight, and more preferably from 0.5 to 2% by weight in terms of amount excluding hydrated water.

Examples of the light-to-heat conversion material preferably used in the hydrophilic layer in the invention include the following substances:

Examples of the light-to-heat conversion material include a general infrared absorbing dye such as a cyanine dye, a chloconium dye, a polymethine dye, an azulenium dye, a squalenium dye, a thiopyrylium dye, a naphthoquinone dye or an anthraquinone dye, and an organometallic complex such as a phthalocyanine compound, a naphthalocyanine compound, an azo compound, a thioamide compound, a dithiol compound or an indoaniline compound. Exemplarily, the light-to-heat conversion materials include compounds disclosed in Japanese Patent O.P.I. Publication Nos. 63-139191, 64-33547, 1-160683, 1-280750, 1-293342, 2-2074, 3-26593, 3-30991, 3-34891, 3-36093, 3-36094, 3-36095, 3-42281, 3-97589 and 3-103476. These compounds may be used singly or in combination.

Compounds described in Japanese Patent O.P.I. Publication Nos. 11-240270, 11-265062, 2000-309174, 2002-49147, 2001-162965, 2002-144750, and 2001-219667 can be preferably used.

Examples of pigment include carbon, graphite, a metal and a metal oxide. Furnace black and acetylene black is preferably used as the carbon. The graininess ($d_{50}$) thereof is preferably not more than 100 nm, and more preferably not more than 50 nm.

The graphite is one having a particle size of preferably not more than 0.5 μm, more preferably not more than 100 nm, and most preferably not more than 50 nm.

As the metal, any metal can be used as long as the metal is in a form of fine particles having preferably a particle size of not more than 0.5 μm, more preferably not more than 100 nm, and most preferably not more than 50 nm. The metal may have any shape such as spherical, flaky and needle-like. Colloidal metal particles such as those of silver or gold are particularly preferred.

As the metal oxide, materials having black color in the visible regions or materials which are electro-conductive or semi-conductive can be used. Examples of the former include black iron oxide and black complex metal oxides containing at least two metals. Examples of the latter include Sb-doped $SnO_2$ (ATO), Sn-added $In_2O_3$ (ITO), $TiO_2$, TiO prepared by reducing $TiO_2$ (titanium oxide nitride, generally titanium black). Particles prepared by covering a core material such as $BaSO_4$, $TiO_2$, $9Al_2O_3.2B_2O$ and $K_2O.nTiO_2$ with these metal oxides is usable. These oxides are particles having a particle size of not more than 0.5 μm, preferably not more than 100 nm, and more preferably not more than 50 nm.

As these light-to-heat conversion materials, black iron oxide or black complex metal oxides containing at least two metals are more preferred.

The black iron oxide ($Fe_3O_4$) particles have an average particle size of from 0.01 to 1 μm, and an acicular ratio (major axis length/minor axis length) of preferably from 1 to 1.5. It is preferred that the black iron oxide particles are substantially spherical ones (having an acicular ratio of 1) or octahedral ones (having an acicular ratio of 1.4).

Examples of the black iron oxide particles include for example, TAROX series produced by Titan Kogyo K.K. Examples of the spherical particles include BL-100 (having a particle size of from 0.2 to 0.6 μm, and BL-500 (having a particle size of from 0.3 to 1.0 μm. Examples of the octahedral particles include ABL-203 (having a particle size of from 0.4 to 0.5 μm, ABL-204 (having a particle size of from 0.3 to 0.4 μm, ABL-205 (having a particle size of from 0.2 to 0.3 μm, and ABL-207 (having a particle size of 0.2 μm.

The black iron oxide particles may be surface-coated with inorganic compounds such as $SiO_2$. Examples of such black iron oxide particles include spherical particles BL-200 (having a particle size of from 0.2 to 0.3 μm) and octahedral particles ABL-207A (having a particle size of 0.2 μm), each having been surface-coated with $SiO_2$.

Examples of the black complex metal oxides include complex metal oxides comprising at least two selected from Al, Ti, Cr, Mn, Fe, Co, Ni, Cu, Zn, Sb, and Ba. These can be prepared according to the methods disclosed in Japanese Patent O.P.I. Publication Nos. 9-27393, 9-25126, 9-237570, 9-241529 and 10-231441.

The complex metal oxide used in the invention is preferably a complex Cu—Cr—Mn type metal oxide or a Cu—Fe—Mn type metal oxide. The Cu—Cr—Mn type metal oxides are preferably subjected to the treatment disclosed in Japanese Patent O.P.I. Publication Nos. 8-27393 in order to reduce isolation of a 6-valent chromium ion. These complex metal oxides have a high color density and a high light heat conversion efficiency as compared with another metal oxide.

The primary average particle size of these complex metal oxides is preferably from 0.001 to 1.0 μm, and more preferably from 0.01 to 0.5 μm. The primary average particle size of from 0.001 to 1.0 μm improves a light heat conversion efficiency relative to the addition amount of the particles, and the primary average particle size of from 0.05 to 0.5 μm further improves a light heat conversion efficiency relative to the addition amount of the particles. The light heat conversion efficiency relative to the addition amount of the particles depends on a dispersity of the particles, and the well-dispersed particles have a high light heat conversion efficiency. Accordingly, these complex metal oxide particles are preferably dispersed according to a known dispersing method, separately to a dispersion liquid (paste), before being added to a coating liquid for the particle containing layer. The metal oxides having a primary average particle size of less than 0.001 are not preferred since they are difficult to disperse. A dispersant is optionally used for dispersion. The addition amount of the dispersant is preferably from 0.01 to 5% by weight, and more preferably from 0.1 to 2% by weight, based on the weight of the complex metal oxide particles.

In the invention, a dye is preferably used, and a dye having a low optical density to visible light is more preferably used, among these.

(Protective Layer)

A protective layer can be provided as an upper layer of the image formation layer.

As materials in the protective layer, the water soluble resin or the water dispersible resin described above can be preferably used. The protective layer in the invention may be a hydrophilic overcoat layer disclosed in Japanese Patent O.P.I. Publication Nos. 2002-19318 and 2002-86948. The coating amount of the protective layer is from 0.01 to 10 $g/m^2$, preferably from 0.1 to 3 $g/m^2$, and more preferably from 0.2 to 2 $g/m^2$.

(On-Press Development and Printing Process)

In the invention, when the printing plate material is exposed to for example, infrared laser, the image formation layer forms oleophilic image portions at exposed portions, and the image formation layer at unexposed portions are removed to form hydrophilic non-image portions. Removal of the image formation layer can be carried out by washing with water, but is preferably carried out by supplying a dampening solution and/or printing ink to the image formation layer on a press (so-called on-press development).

Removal on a press of the image formation layer at unexposed portions of a printing plate material, which is mounted on the plate cylinder, can be carried out by bringing a dampening roller and an inking roller into contact with the image formation layer while rotating the plate cylinder, and can be also carried out according to various sequences such as those described below or another appropriate sequence. The supplied amount of dampening solution may be adjusted to be greater or smaller than the amount ordinarily supplied in printing, and the adjustment may be carried out stepwise or continuously.

(1) A dampening roller is brought into contact with the image formation layer of a printing plate material on the plate cylinder during one to several tens of rotations of the plate cylinder, and then an inking roller brought into contact with the image formation layer during the next one to tens of rotations of the plate cylinder to obtain a printing plate. Thereafter, printing is carried out.

(2) An inking roller is brought into contact with the image formation layer of a printing plate material on the plate cylinder during one to several tens of rotations of the plate cylinder, and then a dampening roller brought into contact with the image formation layer during the next one to tens of rotations of the plate cylinder to obtain a printing plate. Thereafter, printing is carried out.

(3) An inking roller and a dampening roller are brought into contact with the image formation layer of a printing plate material on the plate cylinder during one to several tens of rotations of the plate cylinder to obtain a printing plate. Thereafter, printing is carried out.

The printing process of the invention comprises the step of exposing to UV rays the printing plate on the plate cylinder obtained as described above. As light sources emitting the UV rays, there are a carbon arc lamp emitting light with an emission wavelength in UV regions, a xenon lamp, a mercury lamp, and a metal halide lamp. Of these, a mercury lamp and a metal halide lamp are preferably used. In the invention, the emission wavelength of the UV rays is in the range of preferably from 1 to 400 nm, and more preferably from 100 to 350 nm.

As the mercury lamp, a high pressure or ultrahigh pressure mercury lamp with an emission line spectrum in 313, 365, 406, 436, 546, and 578 nm can be used. A metal halide lamp has a quartz glass tube containing mercury and a metal halide.

It is preferred that exposure is carried out for 1 to 30 seconds at an output power of from 0.1 to 5 kW, the distance between the light source and the printing plate surface being from 0.1 to 50 cm. This printing process renders an image layer formed by laser exposure strong, and greatly improves printing durability of the resulting printing plate.

(Printing Press)

The printing press used in the invention comprises a UV ray irradiation device, which emits UV rays towards the plate cylinder on which a printing plate is to be provided. In the printing press, devices other than the UV ray irradiation device are the same as those provided in a conventional off-set printing press. It is preferred that the UV ray irradiation device, which is provided within or outside the printing press, can uniformly irradiate UV rays over the whole width of the plate cylinder. Examples of a light source for the UV ray irradiation device include those described above.

The UV ray irradiation device can comprise one or more of the light source. Further, one or more UV ray irradiation devices can be installed in the printing press of the invention.

EXAMPLES

The present invention will be explained below employing examples, but is not limited thereto.

Example 1

(Aluminum Support)

A 0.24 mm thick aluminum plate (material 1050, refining H16) was immersed in an aqueous 1% by weight sodium hydroxide solution at 50° C. to give an aluminum dissolution amount of 2 g/$m^2$, washed with water, immersed in an aqueous 0.1% by weight hydrochloric acid solution at 25° C. for 30 seconds to neutralize, and then washed with water.

Subsequently, the aluminum plate was subjected to an electrolytic surface-roughening treatment in an electrolytic solution containing 10 g/liter of hydrochloric acid and 0.5 g/liter of aluminum at a peak current density of 50 A/$dm^2$ employing an alternating current with a sine waveform, in which the distance between the plate surface and the electrode was 10 mm. The electrolytic surface-roughening treatment was divided into 12 treatments, in which the quantity of electricity used in one treatment (at a positive polarity) was 40 C/$dm^2$, and the total quantity of electricity used (at a positive polarity) was 480 C/$dm^2$. Standby time of 5 seconds, during which no surface-roughening treatment was carried out, was provided after each of the separate electrolytic surface-roughening treatments.

Subsequently, the resulting aluminum plate was immersed in an aqueous 1% by weight sodium hydroxide solution at 50° C. and etched to give an aluminum etching amount (including smut produced on the surface) of 1.2 g/$m^2$, washed with water, neutralized in an aqueous 10% by weight sulfuric acid solution at 25° C. for 10 seconds, and washed with water. Subsequently, the aluminum plate was subjected to anodizing treatment in an aqueous 20% by weight sulfuric acid solution at a constant voltage of 20 V, in which a quantity of electricity of 150 C/$dm^2$ was supplied, and washed with water. Thus, aluminum support was prepared.

(Preparation of Hydrophilic Layer)

Materials in a hydrophilic layer coating liquid composition as described below were sufficiently mixed while stirring, and filtered to obtain hydrophilic layer coating liquid S-1 having a solid content of 15% by weight. The hydrophilic layer coating liquid S-1 was coated on the surface-roughened surface of the aluminum support obtained above employing a wire bar, and dried at 100° C. for 3 minutes to give a hydrophilic layer with a dry thickness of 2.0 g/$m^2$, and further aged at 60° C. for 24 hours. Thus, a hydrophilic layer coated aluminum support was prepared.

(Composition of Hydrophilic Layer Coating Liquid S-1)

| Light-to-heat conversion metal oxide particles | |
|---|---|
| Black iron oxide particles ABL-207 (produced by Titan Kogyo K. K., octahedral form, average particle size: 0.2 μm, acicular ratio: substantially 1, specific surface area: 6.7 $m^2$/g, Hc: 9.95 kA/m, σs: 85.7 $Am^2$/kg, σr/σs: 0.112) | 12.50 weight parts |
| Colloidal silica (alkali type): Snowtex XS (particle size: 4–6 μm, solid content: 20% by weight, produced by Nissan Kagaku Co., Ltd.) | 60.62 weight parts |
| Aqueous 10% by weight sodium phosphate.dodecahydrate (Reagent produced by Kanto Kagaku Co., Ltd.) solution | 1.13 weight parts |
| Aqueous 20% by weight solution of chitosan Flownack S (produced by Kyowa Technos Co., Ltd.) | 2.50 weight parts |
| Surfactant: Surfinol 465 (produced by Air Products Co., Ltd.,) 1% by weight aqueous solution | 1.25 weight parts |
| Pure water | 22.00 weight parts |

(Preparation of Image Formation Layer)

(Composition of Image Formation Layer Coating Liquid P-1)

| | |
|---|---|
| Carnauba wax emulsion A118 (wax with a melting point of 80° C. having an average particle size of 0.4 μm, and having a solid content of 40% by weight, produced by Gifu Shellac Co., Ltd.) | 16.5 weight parts |
| Aqueous solution of disaccharide Trehalose, Treha (mp. 97° C., produced by Hayashihara Shoji Co., Ltd.) having a solid content of 10% by weight) | 5.0 weight parts |
| Aqueous solution of sodium polyacrylate, AQUALIC DL522 (produced by Nippon Shokubai Co., Ltd., solid content: 10% by weight) | 5.0 weight parts |
| Colloidal silica: Snowtex PS-M (solid content: 20% by weight, produced by Nissan Kagaku Co., Ltd.) | 10.0 weight parts |
| Ethanol 1 weight % solution of light-to-heat conversion dye ADS830AT (Produced by American Dye Source Co., Ltd.) | 30.0 weight parts |
| Pure water | 33.5 weight parts |

(Image Formation Layer Coating Liquid P-2)

| | |
|---|---|
| Water-dispersible polymer: NK polymer RP-116ES (containing an acryloyl/methacryloyl group, having a Tg of the main chain of −45° C., and a solid content of 35% by weight, produced by Shinnakamura Kagaku Co., Ltd.) | 26.3 weight parts |
| UV absorbent: Newcoat UVA-1025W (solid content: 40% by weight, produced by Shinnakamura Kagaku Co., Ltd.) | 0.8 weight parts |
| Anti-decomposition agent: Newcoat HAL-11025W (solid content: 40% by weight, produced by Shinnakamura Kagaku Co., Ltd.) | 0.5 weight parts |
| Ethanol 1 weight % solution of light-to-heat conversion dye ADS830AT (Produced by American Dye Source Co., Ltd.) | 30.0 weight parts |
| Pure water | 42.4 weight parts |

(Image Formation Layer Coating Liquid P-3)

Image formation layer coating liquid P-3 was prepared in the same manner as in image formation layer coating liquid P-2 above, except that NK polymer RP-116E (containing an acryloyl/methacryloyl group, having a Tg of the main chain of 20° C., and a solid content of 35% by weight, produced by Shinnakamura Kagaku Co., Ltd.) was used as water-dispersible polymer instead of NK polymer RP-116ES.

(Image Formation Layer Coating Liquid P-4)

Image formation layer coating liquid P-4 was prepared in the same manner as in image formation layer coating liquid P-2 above, except that NK polymer RP-116EH (containing an acryloyl/methacryloyl group, having a Tg of the main chain of 80° C., and a solid content of 35% by weight, produced by Shinnakamura Kagaku. Co., Ltd.) was used as water-dispersible polymer instead of NK polymer RP-116ES.

(Image Formation Layer Coating Liquid P-5)

| | |
|---|---|
| Water-dispersible polymer: NK polymer RP-116EH (containing an acryloyl/methacryloyl group, having a Tg of the main chain of 80° C., and a solid content of 35% by weight, produced by Shinnakamura Kagaku Co., Ltd.) | 23.4 weight parts |
| UV absorbent: Newcoat UVA-1025W (solid content: 40% by weight, produced by Shinnakamura Kagaku Co., Ltd.) | 0.8 weight parts |
| Anti-decomposition agent: Newcoat HAL-11025W (solid content: 40% by weight, produced by Shinnakamura Kagaku Co., Ltd.) | 0.5 weight parts |
| Aqueous solution of sodium polyacrylate, AQUALIC DL522 (produced by Nippon Shokubai Co., Ltd., solid content: 10% by weight) | 10.0 weight parts |
| Ethanol 1 weight % solution of light-to-heat conversion dye ADS830AT (Produced by American Dye Source Co., Ltd.) | 30.0 weight parts |
| Pure water | 35.3 weight parts |

(Preparation of Printing Plate Material Samples 1 Through 12)

Printing plate material samples having constitutions as shown in Table 1 were prepared. The image formation layer coating liquid was coated on the aluminum support or the hydrophilic layer coated aluminum support each obtained above, employing a wire bar, and dried at 55° C. for 3 minutes to give an image formation layer with a dry thickness of 1.50 g/m$^2$. Thereafter, the resulting sample was aged at 40° C. for 24 hours. Thus, printing plate material samples 1 through 12 were obtained.

(Image Formation Employing Infrared Laser)

Each of the resulting printing plate material samples was mounted on an exposure drum, and imagewise exposed. The exposure was carried out employing an infrared laser (having a wavelength of 830 nm and a beam spot size of 20 μm) at an exposure energy of 250 mJ/cm$^2$, at a resolution of 2400 dpi ("dpi" herein shows the number of dots per 2.54 cm), and at a screen line number of 175 to form an image. The image pattern used for exposure had a solid image, and a dot image with a dot area of from 1 to 99%.

Printing Method

Printing was carried out employing a printing press, DAIYA 1F-1 produced by Mitsubishi Jukogyo Co., Ltd., and employing coated paper, a dampening solution, a 2% by weight solution of Astromark 3 (produced by Nikken Kagaku Kenkyusyo Co., Ltd.), and printing ink (TK Hy-Unity Magenta, produced by Toyo Ink Manufacturing Co.).

Each of the exposed printing plate material samples was mounted on a plate cylinder of the printing press, and printing was carried out in the same printing sequence as a conventional PS plate.

(Cure of Image Formation Layer Due to UV Irradiation)

After 100 prints were obtained, the printing plate material sample mounted on the plate cylinder was exposed to UV light for 60 seconds, employing a 1 Kw metal halide lamp, in which the distance between the lamp and the sample surface was 30 cm.

(Evaluation)

Initial Printability

The smallest number of paper sheets printed from when printing started till when a print with stable ink density at image portions and without stain at non-image portions was obtained was counted and evaluated as a measure of initial printability. A sample providing the smallest number of not more than 20 was evaluated as acceptable.

Printing Durability

The number of paper sheets, printed from when printing started till when dots of the image with a dot area of 3% began lacking, was counted, and evaluated as a measure of printing durability. A sample providing the number of not less than 100,000 was evaluated as acceptable.

Anti-stain Property

An optical density at non-image portions (corresponding to unexposed portions) of prints was measured as a measure of an anti-stain property through Macbeth RD918 at a mode of M. A sample providing an optical density of less than 0.1 was evaluated as acceptable.

Storage Stability

Each printing plate material was stored at 55° C. for 24 hours in a thermostatic oven, and then the resulting sample was evaluated for initial printability and stain at non-image portions in the same manner above.

The results are shown in Table 1.

TABLE 1

| Sample No. | Image formation layer coating liquid used | Hydrophilic layer coating liquid used | UV irradiation on a press | Initial printability (number) | Antistain property (optical density) | Printing durability (number) | Storage stability: Initial printability (number) | Storage stability: Antistain property (optical density) | Remarks |
|---|---|---|---|---|---|---|---|---|---|
| 1 | P-1 | None | No | 8 | 0.08 | 18,000 | 25 | 0.22 | Comp. |
| 2 | P-2 | None | No | 22 | 0.14 | 55,000 | 56 | 0.25 | Comp. |
| 3 | P-3 | None | No | 16 | 0.09 | 105,000 | 18 | 0.09 | Inv. |
| 4 | P-4 | None | No | 15 | 0.09 | 110,000 | 16 | 0.09 | Inv. |
| 5 | P-5 | None | No | 10 | 0.08 | 110,000 | 11 | 0.08 | Inv. |
| 6 | P-1 | S-1 | No | 7 | 0.08 | 19,000 | 20 | 0.15 | Comp. |
| 7 | P-2 | S-1 | No | 21 | 0.09 | 62,000 | 24 | 0.13 | Comp. |

TABLE 1-continued

| Sample No. | Image formation layer coating liquid used | Hydrophilic layer coating liquid used | UV irradiation on a press | Initial printability (number) | Antistain property (optical density) | Printing durability (number) | Storage stability Initial printability (number) | Storage stability Antistain property (optical density) | Remarks |
|---|---|---|---|---|---|---|---|---|---|
| 8 | P-3 | S-1 | No | 14 | 0.07 | 110,000 | 15 | 0.08 | Inv. |
| 9 | P-4 | S-1 | No | 12 | 0.07 | 115,000 | 14 | 0.08 | Inv. |
| 10 | P-5 | S-1 | No | 8 | 0.07 | 113,000 | 9 | 0.07 | Inv. |
| 11 | P-5 | None | Yes | 10 | 0.08 | ≧120,000 | 11 | 0.08 | Inv. |
| 12 | P-5 | S-1 | Yes | 8 | 0.08 | ≧120,000 | 9 | 0.07 | Inv. |

Inv.: Inventive,
Comp.: Comparative

As is apparent from Table 1 above, inventive samples provide prints with a sharp image, good on-press developability, high printing durability, print image with no stain at non-image portions, and excellent printability.

What is claimed is:

1. A printing plate material comprising a surface roughened aluminum support, and provided thereon, a hydrophilic layer containing a light-to-heat conversion material and metal oxide particles, and an image formation layer containing a heat-curable polymer having a main chain polymer in the main chain, and an acryloyl group or a methacryloyl group in the side chain, in which a glass transition temperature Tg of the main chain polymer is from 0 to 100° C., the hydrophilic layer being provided between the aluminum support and the image formation layer, wherein the printing plate material is capable of being developed on a printing press.

2. The printing plate material of claim 1, wherein the glass transition temperature Tg of the main chain polymer is from 10 to 95° C.

3. The printing plate material of claim 1, wherein the glass transition temperature Tg of the main chain polymer is from 20 to 85° C.

4. The printing plate material of claim 1, wherein the image formation layer contains the heat-curable polymer in an amount of from 50 to 99% by weight.

5. The printing plate material of claim 1, wherein the heat-curable polymer further has a carboxyl group.

6. The printing plate material of claim 1, wherein the heat-curable polymer is capable of being cured by UV irradiation.

7. The printing plate material of claim 1, wherein the image formation layer further contains a water-soluble resin.

8. The printing plate material of claim 1, wherein the metal oxide particles are selected from colloidal silica, alumina sol, and titania sol.

9. A printing process comprising the steps of:

providing the printing plate material of claim 1 on a plate cylinder of a printing press;

imagewise exposing the printing plate material;

printing by supplying printing ink and dampening water to the imagewise exposed printing plate material to form an image on the printing plate material; and then further exposing the printing plate material to ultraviolet light, whereby the formed image is strengthened.

* * * * *